United States Patent [19]

Kawanabe

[11] 4,426,626
[45] Jan. 17, 1984

[54] SIGNAL SWITCHING CIRCUIT

[75] Inventor: Yoshihiro Kawanabe, Tokyo, Japan

[73] Assignee: Pioneer Electronic Corporation, Tokyo, Japan

[21] Appl. No.: 282,693

[22] Filed: Jul. 13, 1981

[30] Foreign Application Priority Data

Jul. 14, 1980 [JP] Japan .................. 55-99046[U]

[51] Int. Cl.³ .............................................. H03F 3/26
[52] U.S. Cl. ...................................... 330/267; 330/295
[58] Field of Search ........................ 330/295, 263, 267

[56] References Cited

U.S. PATENT DOCUMENTS 3,493,878  2/1970  Fautale ............................. 330/263
3,889,202  6/1975  Suzuki .............................. 330/267

Primary Examiner—James B. Mullins
Assistant Examiner—Gene Wan
Attorney, Agent, or Firm—Sughrue, Mion, Zinn, Macpeak and Seas

[57] ABSTRACT

A signal switching circuit in which distortion caused by non-linearity of a signal path between a control electrode of an output transistor and a common junction output terminal is eliminated. The switching circuit includes plural amplifiers with outputs of the amplifiers being coupled to a common junction point and with a control signal coupled to each amplifier for enabling or disabling the amplifier. A by-pass impedance element having a linear voltage-current characteristic is coupled between the control electrode of each transistor and the common output junction point.

4 Claims, 5 Drawing Figures

SIGNAL SWITCHING CIRCUIT

BACKGROUND OF THE INVENTION

The present invention relates to a signal switching circuit, and more particularly to a signal switching circuit provided with an amplifying function.

In a prior art signal switching circuit, a plurality of amplifiers are provided, corresponding in number to the number of input signals. Outputs of these amplifiers are commonly connected. A particular input signal is amplified by the associated amplifiers thereby providing an amplified output. In actual operation, all amplifiers except one are disabled.

FIG. 1 is a circuit diagram showing such a signal switching circuit in which amplifiers 1 and 2 corresponding respectively to input signals on terminals IN-1 and IN-2 are provided with the outputs of the two amplifiers coupled to a common output terminal OUT. In response to control signals on terminals CONT-1 and CONT-2 applied respectively to the amplifiers 1 and 2, one of the two input signals is selectively amplified by the associated amplifier and the resultant output is obtained at the common output terminal OUT. Since the circuit arrangement of the amplifier 2 is similar to that of the amplifer 1, only the circuit arrangement of the amplifier 1 is shown in FIG. 1.

In the amplifier 1, the input signal on the terminal IN-1 is applied as a differential input to the first differential amplifier including a pair of differential transistors $Q_1$ and $Q_2$. Voltages developed across collector resistors $R_1$ and $R_2$ of the transistors $Q_1$ and $Q_2$ are applied as differential inputs to the second differential amplifier. A current source for the first differential amplifier is provided which includes a transistor $Q_3$, a resistor $R_3$, and a bias supplying source E. The base potential of the transistor $Q_3$ is controlled by a switching transistor $Q_4$ to thereby cause the differential amplifier to be either enabled or disabled. To this effect, a control signal is applied to the base of the transistor $Q_4$. Resistor $R_4$ is provided for restricting the current applied to the base of the transistor $Q_3$.

The second differential amplifier including a pair of transistors $Q_5$ and $Q_6$, emitter resistors $R_5$ and $R_6$, and a current mirror circuit, operates as an active load for the transistors $Q_5$ and $Q_6$. The current mirror circuit includes a transistor $Q_7$, a diode $D_1$, and resistors $R_7$ and $R_8$. Between the collectors of the transistors $Q_6$ and $Q_7$, series-connected diodes $D_2$ and $D_3$ are arranged. The voltage developed across the series-connected diodes $D_2$ and $D_3$ provides base driving signals for output push-pull transistors $Q_8$ and $Q_9$. The output transistors $Q_8$ and $Q_9$ are connected as complementary transistors with emitters being commonly connected to each other in an emitter follower configuration. The common emitter junction point is coupled to the output terminal OUT to which the output of the other amplifier is also coupled.

In the circuit arrangement shown in FIG. 1, when the control signal on the terminal CONT-1 is at a high level and the control signal on the terminal CONT-2 is a low level, the amplifier 1 is disabled. Therefore, only the input signal on the terminal IN-2 is amplified by the amplifier 2 and the output thereof provided at the output terminal OUT. In this operation, the circuit of the amplifier 1 forms a part of a load for the amplifier 2.

Here, the impedance of the amplifier 1 from the output terminal OUT is extremely large in the low frequency range. Thus, the amplifier 1 has substantially no effect upon the amplifying operation of the amplifier 2. In the high frequency range, however, stray capacitances existing between the base of the transistor $Q_8$ and ground and between the base of the transistor $Q_9$ and ground are not negligible. The impedance Z of the amplifier 2 is equivalent to that obtained from the circuit shown in FIG. 2. In the circuit of FIG. 2, $D_8$ and $D_9$ are base-emitter PN junction diodes of the emitter follower transistors $Q_8$ and $Q_9$, respectively. Specifically, in the high frequency range, the impedance Z of the amplifier 2 causes distorion of the signal on the output terminal OUT due to the non-linearity of the diodes $D_8$ and $D_9$.

SUMMARY OF THE INVENTION

Accordingly, an object of the invention is to eliminate distortion caused by the non-linearity of a signal path between control electrodes of an output transistor and a common junction output terminal.

In accordance with the invention, an improvement is made to a signal switching circuit including a plurality of amplifiers provided in a number corresponding to the number of input signals. Output transistors connected in an emitter follower configuration are provided in the output stage of each amplifier and the outputs of the amplifiers are commonly coupled to a common junction point so that the outputs of the amplifiers can be selectively obtained at the common junction point. Control signals are applied to the amplifiers so that all the amplifiers except the one to be operated are disabled and the output of the operating amplifier provides an output to the common junction point. A by-pass impedance element having a linear voltage-current characterisitic is provided in the path between the control electrode of the output transistor and the common junction point.

DESCRIPTION OF THE PREFERRED EMBODIMENTS

Figure 1:
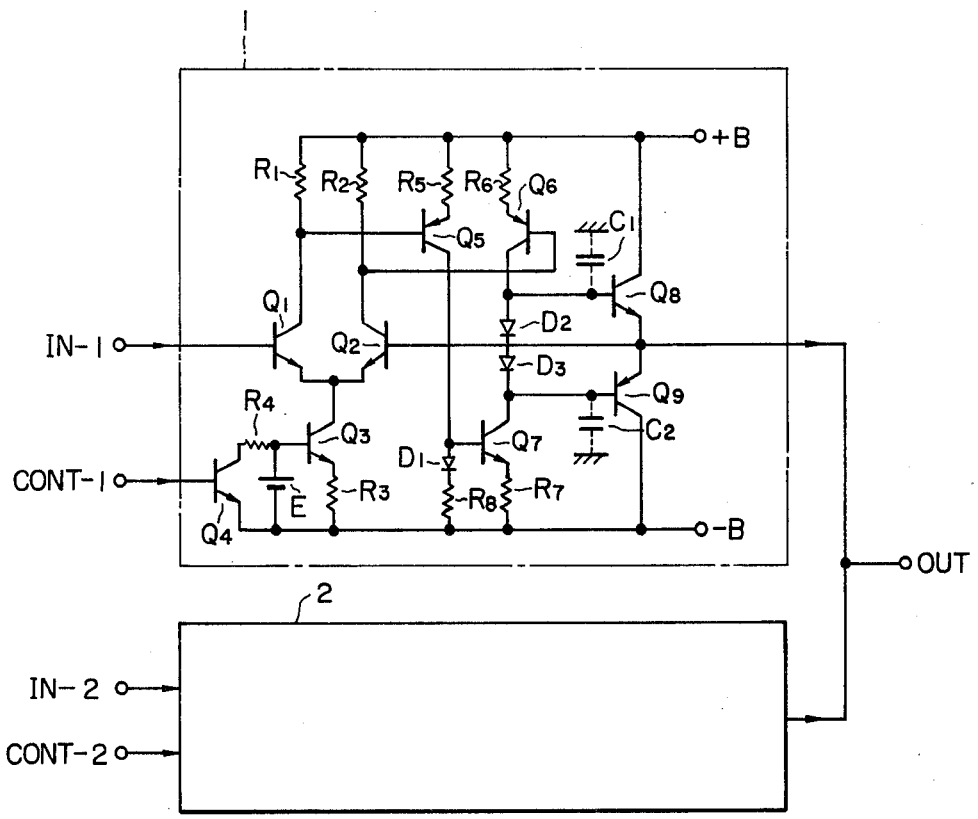
FIG. 1 is a circuit diagram showing a prior art signal switching circuit.
Figure 2:
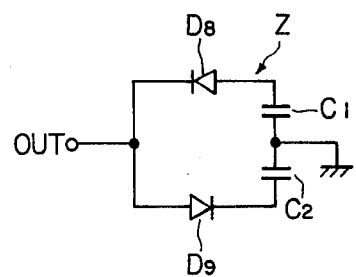
FIG. 2 is a circuit diagram of an equivalent circuit corresponding to a part of the circuit shown in FIG. 1.
Figure 3:
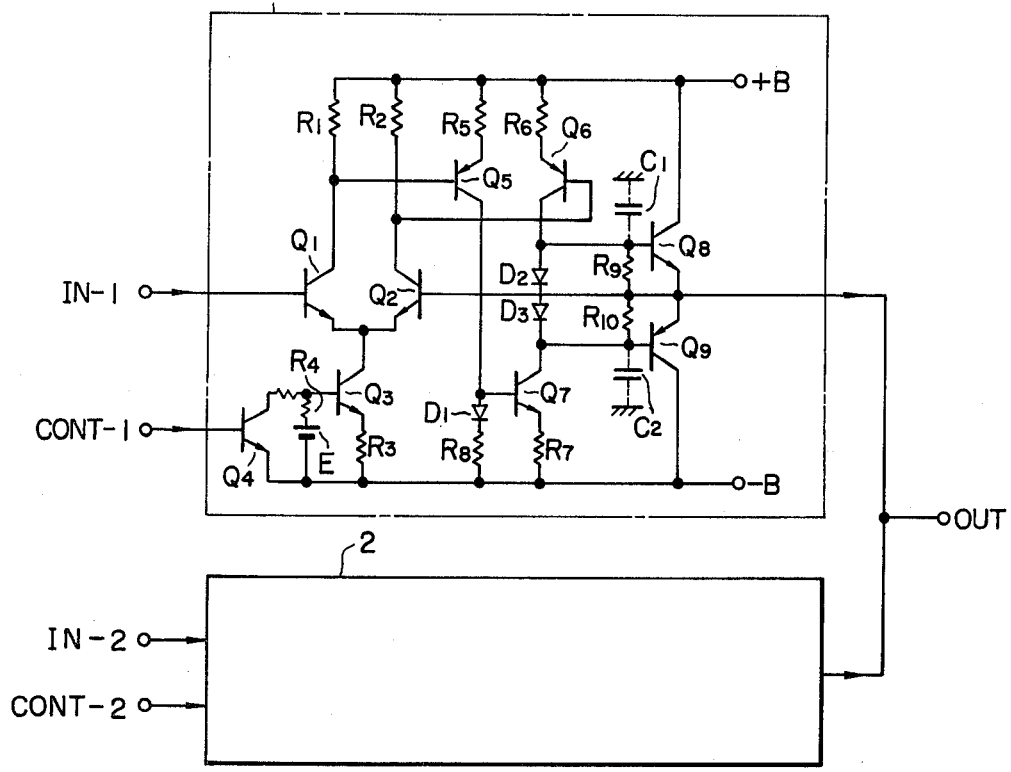
FIG. 3 is a circuit diagram showing a signal switching circuit according to the invention.

The invention will be described with reference to the accompanying drawings. FIG. 3 is a circuit diagram showing a preferred embodiment of a signal switching circuit according to the invention where like numerals or like symbols denote like parts or like components in FIG. 1. Although only the specific circuit arrangement of the amplifier 1 is shown therein, the circuit arrangement of the amplifier 2 is the same as that of the amplifier 1. In the figure, impedance elements having linear characteristics, specifically resistors $R_9$ and $R_{10}$, are employed in the illustrated embodiment, and are respectively connected between the bases and the emitters of the emitter follower-connected transistors $Q_8$ and $Q_9$, in other words, between the control electrodes of the output transistors and the output terminal OUT. In this circuit, charge stored in the capacitors $C_1$ and $C_2$ flows through the resistors $R_9$ and $R_{10}$, respectively, provided as by-passes for the base-emitter junctions of the output transistors $Q_8$ and $Q_9$.

Figure 4A:
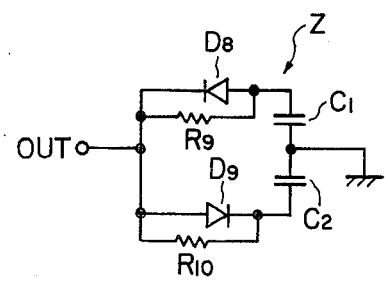
FIGS. 4A and 4B are circuit diagrams of equivalent circuits corresponding to parts of the circuits shown in FIG. 3.

In the case where the amplifier 1 is disabled and the amplifier 2 is enabled so that the input signal on the terminal IN-2 is selectively outputted, the high frequency range impedance Z of the amplifier 1 from the output terminal OUT is equivalent to the impedance of the circuit shown in FIG. 4A. Accordingly, provided that the impedances of the resistors $R_9$ and $R_{10}$ are sufficiently small relative to the impedances of the parasitic capacitors $C_1$ and $C_2$, the diodes $D_8$ and $D_9$ are not rendered conductive and provide infinite impedances.

Figure 4B:
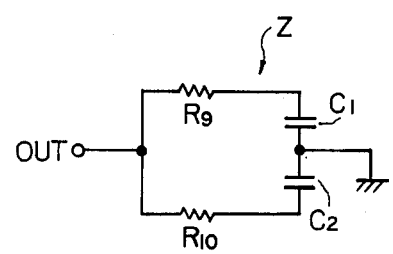

Under this condition, the equivalent circuit can be depicted as shown in FIG. 4B. Specifically, due to the provision of the by-pass circuits of the resistors $R_9$ and $R_{10}$, distortion caused by the non-linearity of the base-emitter diodes of the output transistors is substantially eliminated. Since the circuit shown in FIG. 4B is a linear circuit, no signal distortion is caused by the provision of the by-pass resistors. Although in the preferred embodiment, resistors are employed as by-pass impedance elements, any linear impedance element having an appropriate value can be used.

According to the invention, signal distortion is suppressed with an extremely simple circuit arrangement. Moreover, although the invention has been described with respect to a preferred embodiment, it will be appreciated by one skilled in the art that a variety of changes and modifications may be made without departing from the scope of the invention. For example, a source follower configuration employing junction type FETs is usable in place of the emitter follower configuration employing bipolar transistors. Furthermore, it is apparent that the invention is applicable not only for switching between two input signals but also for switching among a plurality of input signals.

What is claimed is:

1. In a signal switching circuit of the type comprising first and second output transistors coupled through an emitter follower arrangement to a common junction point, said output transistors having respective control electrodes connected to first and second sides of a plurality of series-connected diodes, a means far eliminating distortions produced by stray capacitances which exist between said respective control electrodes of said output transistors and ground during high frequency operations of said signal switching circuit, said stray capacitances producing said distortions by discharging through said diodes to render said diodes conductive, comprising:

a first by-pass impedance element having a linear voltage-current characteristic connected between said control electrode of said output transistor and said common junction point; and a second by-pass impedance element having a linear voltage-current characteristic connected between said control electrrode of said second output transistor and said common junction point;

said by-pass impedances receiving said discharge of said stray capacitances and preventing said discharge from rendering said diodes conductive.

2. The circuit recited in claim 1, wherein each of said impedances comprises resistors.

3. In a signal switching circuit of the type comprising a plurality of amplifiers corresponding to a number of input signals, said amplifiers being capable of amplifying respective input signals and being either enabled or disabled in response to respective control signals applied thereto, each of said plurality of amplifiers having an output stage having output transistors connected in a voltage-follower configuration, said output transistors each having a control electrode, outputs of said plurality of amplifiers being commonly coupled to a common junction point, and wherein all said amplifiers except an amplifier to be operated are disabled by the application of control signals so that the output of only one amplifier is obtained at said common junction point, a circuit for eliminating distortions produced by stray capacitances which exist between said respective control electrodes of said output transistors and ground during high frequency operations of said signal switching circuit, said stray capacitances producing said distortions by discharging through said diodes to render said diodes conductive, comprising:

a first by-pass impedance element having a linear voltage-current characteristic connected between said respective control electrode of a first of said output transistors and said common junction point; and a second by-pass impedance element having a linear voltage-current characteristic connected between said respective control electrode of a second of said output transistors and said common junction point;

said by-pass impedances preventing said diodes from receiving said discharge.

4. The circuit recited in claim 3, wherein each of said impedances comprises resistors.

* * * * *